(12) United States Patent
Oh et al.

(10) Patent No.: US 9,390,776 B1
(45) Date of Patent: Jul. 12, 2016

(54) DATA STROBING CIRCUIT AND SEMICONDUCTOR APPARATUS USING THE SAME

(71) Applicant: SK hynix Inc., Icheon-si Gyeonggi-do (KR)

(72) Inventors: Seung Wook Oh, Icheon-si (KR); Jae Il Kim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/626,464

(22) Filed: Feb. 19, 2015

(30) Foreign Application Priority Data

Dec. 22, 2014 (KR) .......................... 10-2014-0186106

(51) Int. Cl.
  *G11C 8/18* (2006.01)
  *G11C 7/22* (2006.01)
  *G11C 7/10* (2006.01)

(52) U.S. Cl.
  CPC .. *G11C 7/22* (2013.01); *G11C 7/10* (2013.01); *G11C 8/18* (2013.01)

(58) Field of Classification Search
  CPC ......................................................... G11C 8/18

USPC ................................................... 365/193, 194
See application file for complete search history.

(56) References Cited

U.S. PATENT DOCUMENTS

| | | | | |
|---|---|---|---|---|
| 7,606,089 B2 * | 10/2009 | Joo | ...................... | G11C 7/1066 365/194 |
| 8,045,406 B2 * | 10/2011 | Kwon | ...................... | G11C 7/22 365/191 |
| 8,369,159 B2 * | 2/2013 | Kim | ...................... | G11C 29/022 365/189.02 |
| 8,385,143 B2 * | 2/2013 | Park | ...................... | G11C 7/22 365/189.14 |

FOREIGN PATENT DOCUMENTS

KR 100871377 B1 11/2008

* cited by examiner

*Primary Examiner* — Son Mai
(74) *Attorney, Agent, or Firm* — William Park & Associates Ltd.

(57) ABSTRACT

A data strobing circuit may include: an operating speed detection unit configured to detect an operating speed of a semiconductor apparatus according to a clock signal, and generate a control signal with a different value depending on the detected operating speed; and a strobe signal generation unit configured to adjust a delay time and pulse width of a read pulse according to the control signal and output an adjusted signal as a strobe signal.

19 Claims, 4 Drawing Sheets

DATA STROBING CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2014-0186106, filed on Dec. 22, 2014, in the Korean Intellectual Property Office, which is incorporated herein by reference in its entirety.

BACKGROUND

1. Technical Field

Various embodiments relate to a semiconductor circuit, and more particularly, to a data strobing circuit and a semiconductor apparatus using the same.

2. Related Art

In a semiconductor apparatus, there may exist physical positional differences among memory blocks, for example, memory banks, skew of a global input/output line, and differences in operating speed among the memory banks.

Since the operating speed of the semiconductor apparatus, that is, the operating frequency increases in a state where the above-described skew and differences exist, it becomes difficult to strobe data at precise timing.

SUMMARY

In an embodiment of the invention, a data strobing circuit may include an operating speed detection unit configured to detect an operating speed of a semiconductor apparatus according to a clock signal, and generate a control signal with a different value depending on the detected operating speed. The data strobing circuit may also include a strobe signal generation unit configured to adjust a delay time and pulse width of a read pulse according to the control signal and output an adjusted signal as a strobe signal.

In an embodiment of the invention, a data strobing circuit to may include an operating speed detection unit configured to divide a value of a counting signal, generated by counting a clock signal, into a plurality of ranges using an oscillation signal, and generate a control signal having different values allocated to the respective ranges. The data strobing circuit may also include a strobe signal generation unit configured to differently adjust a delay time and pulse width of a read pulse generated in response to a read command, according to the control signal, and output an adjusted signal as a strobe signal.

In an embodiment of the invention, a semiconductor apparatus may include a latch unit configured to generate read data by receiving and latching data transmitted from one or more memory blocks through a global input/output line according to a strobe signal. The semiconductor apparatus may also include a data output unit configured to output the read data to an exterior portion outside of the semiconductor apparatus. The semiconductor apparatus may also include a data strobing circuit configured to detect an operating speed of the semiconductor apparatus according to a clock signal, generate a control signal with a different value according to the detected operating speed, adjust a delay time and pulse width of a read pulse according to the control signal, and output an adjusted signal as the strobe signal.

DETAILED DESCRIPTION

Hereinafter, a data strobing circuit and a semiconductor apparatus using the same according to the invention will be described below with reference to the accompanying figures through various embodiments. Moreover, various embodiments are directed to a data strobing circuit capable of strobing data at precise timing, and a semiconductor apparatus using the same.

Figure 1:
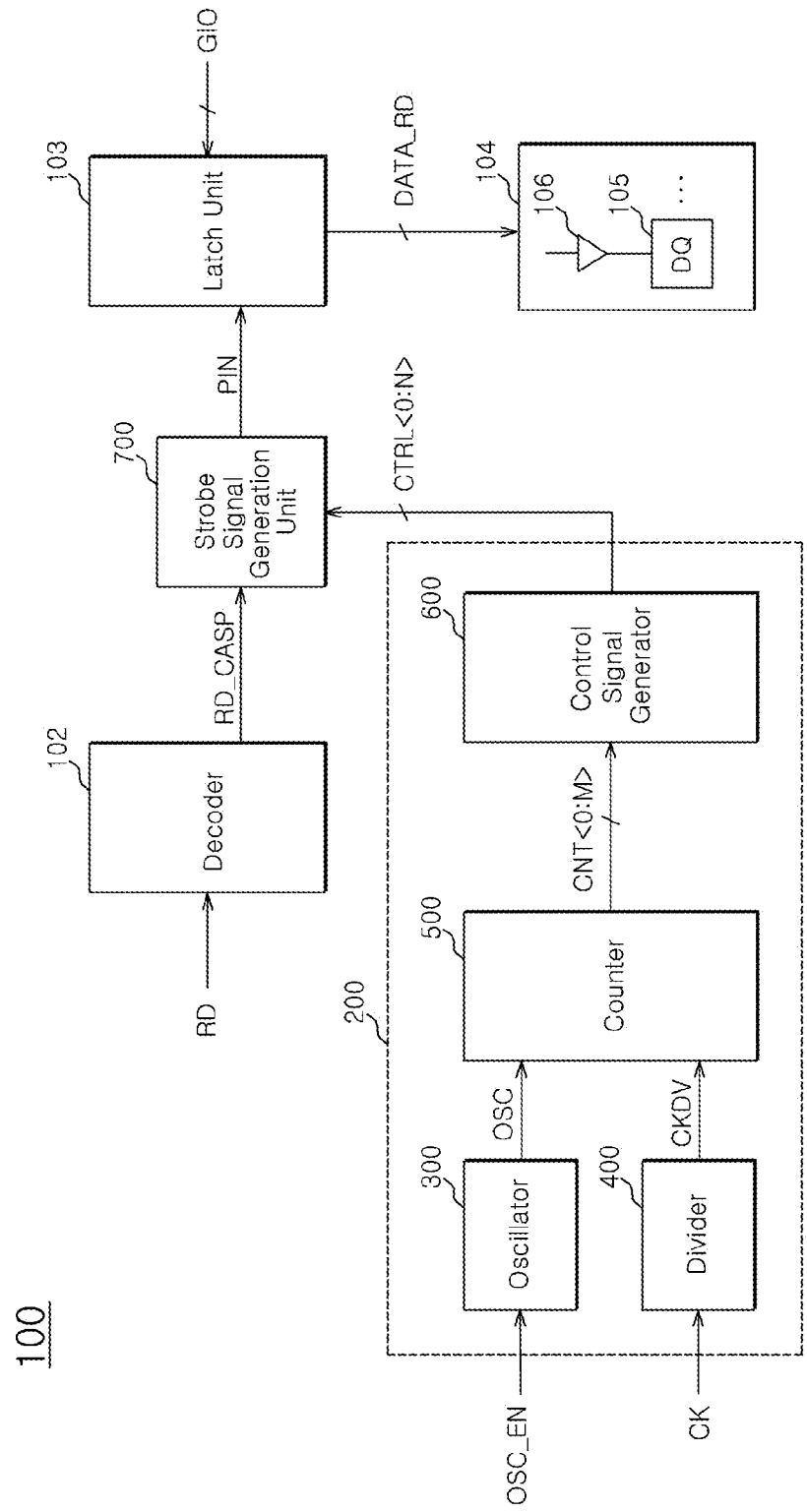
FIG. 1 is a diagram illustrating the configuration of a to semiconductor apparatus 100 according to an embodiment of the invention.

Referring to FIG. 1, a semiconductor apparatus 100 according to an embodiment of the invention may generate a strobe signal PIN by varying the delay time and pulse width of a read pulse RD_CASP generated in response to a read command RD according to the operating speed of the semiconductor apparatus 100. The semiconductor apparatus 100 may also latch data transmitted through a global input/output line GIO according to the strobe signal PIN, and output the latched data to the outside of the semiconductor apparatus 100.

The semiconductor apparatus 100 according to an embodiment of the invention may include a decoder 102, a latch unit 103, a data output unit 104, and a data strobing circuit.

The decoder 102 may be configured to generate the read pulse RD_CASP by decoding an external command, for example, the read command RD.

The latch unit 103 may be configured to generate the read data DATA_RD by receiving and latching data transmitted through the global input/output line GIO according to the strobe signal PIN.

The global input/output line GIO may be electrically coupled to a memory block, for example, a memory bank.

The latch unit 103 may include a pipe latch.

The data output unit 104 may be configured to output the read data DATA_RD to the outside or to exterior portion outside of the semiconductor apparatus 100.

The data output unit 104 may include a plurality of pads DQ 105 and a plurality of drivers 106.

The plurality of drivers 106 may be configured to drive the read data DATA_RD and provide the driven data to the plurality of pads DQ 105.

The data strobing circuit may include an operating speed detection unit 200 and a strobe signal generation unit 700.

The operating speed detection unit 200 may be configured to detect the operating speed of the semiconductor apparatus 100 according to a clock signal CK. In addition, the operating speed detection unit 200 may also generate a control signal CTRL<0:N> having a different value depending on the detected operating speed.

The operating speed detection unit 200 may include an oscillator 300, a divider 400, a counter 500, and a control signal generator 600.

The oscillator 300 may be configured to generate an oscillation signal OSC according to an enable signal OSC_EN.

The divider 400 may be configured to generate a divided clock signal CKDV by dividing the clock signal CK.

The counter 500 may be configured to count the divided clock signal CKDV using the oscillation signal OSC. Further, the counter 500 may output the count value as a counting signal CNT<0:M>.

The counter 500 may be configured to count the pulse number of the divided clock signal CKDV during a high-level period or a predetermined level period of the oscillation signal OSC, and output the count value as the counting signal CNT<0:M>.

The control signal generator 600 may be configured to generate the control signal CTRL<0:N> by decoding the counting signal CNT<0:M>.

The control signal generator 600 may be configured to generate the control signal CTRL<0:N> having a different value depending on the counting signal CNT<0:M>. Accordingly, the operating speed detection unit 200 may divide the value of the counting signal CNT<0:M> generated by counting a clock signal CK into a plurality of ranges using an oscillation signal, and generate the control signal CNT<0:M> having different values allocated to the respective ranges.

The strobe signal generation unit 700 may be configured to differently adjust the delay time and pulse width of the read pulse RD_CASP in response to a read command RD according to the control signal CTRL<0:N> and output the adjusted signal as the strobe signal PIN.

Figure 2:
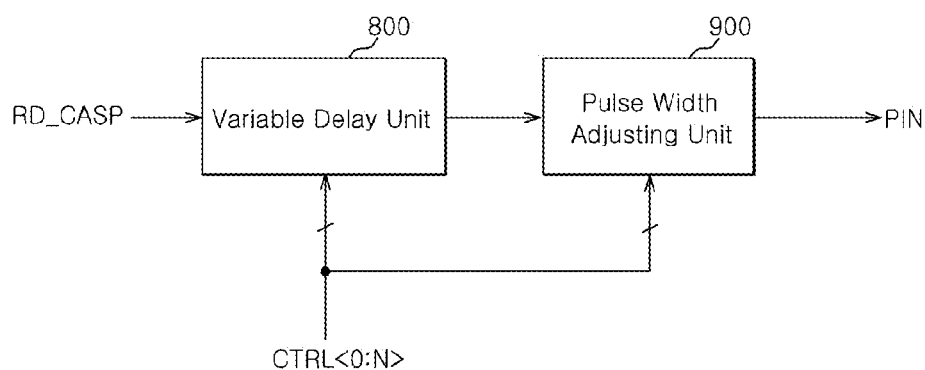
FIG. 2 is a diagram illustrating the internal configuration of a strobe signal generation unit 700 of FIG. 1.

Referring to FIG. 2, the strobe signal generation unit 700 may include a variable delay unit 800 and a pulse width adjusting unit 900.

The variable delay unit 800 may be configured to delay the read pulse RD_CASP by a delay time varied according to the control signal CTRL<0:N>.

The pulse width adjusting unit 900 may be configured to adjust the pulse width of a signal outputted from the variable delay unit 800 according to the control signal CTRL<0:N> and output the adjusted signal as the strobe signal PIN.

Referring to FIGS. 1 to 3, the data strobing operation of the semiconductor apparatus 100 according to an embodiment of the invention will be described as follows.

The value of the counting signal CNT<0:M> outputted from the counter 500 of FIG. 1 may differ depending on the operating to speed of the semiconductor apparatus 100, or, the frequency of the clock signal CK.

As the operating speed of the semiconductor apparatus 100 increases, or, as the frequency of the clock signal CK increases, the value of the counting signal CNT<0:M> may increase.

As the operating speed of the semiconductor apparatus 100 decreases, or, as the frequency of the clock signal CK decreases, the value of the counting signal CNT<0:M> may decrease.

Thus, in an embodiment of the invention, the decoding logic of the control signal generator 600 may be designed in such a manner that the value of the counting signal CNT<0:M> serving as a determination reference value for the operating speed of the semiconductor apparatus 100 is divided into a plurality of ranges. In addition, the control signals CTRL<0:N> having different values are allocated to the values of the counting signal CNT<0:N> which belong to the respective ranges.

For example, suppose that the value of the counting signal CNT<0:M> is divided into first to third ranges in ascending order.

When the value of the counting signal CNT<0:M> belongs to the third range, or, the value of the counting signal CNT<0:M> is larger than the second range, it may indicate that the operating speed of the semiconductor apparatus 100 is high. In this case, the operation of the semiconductor apparatus 100 may be referred to as a high-speed operation.

When the value of the counting signal CNT<0:M> belongs to to the first range, or, the value of the counting signal CNT<0:M> is smaller than the second range, it may indicate that the operating speed of the semiconductor apparatus 100 is low. In this case, the operation of the semiconductor apparatus 100 may be referred to as a low-speed operation.

Figure 3A:
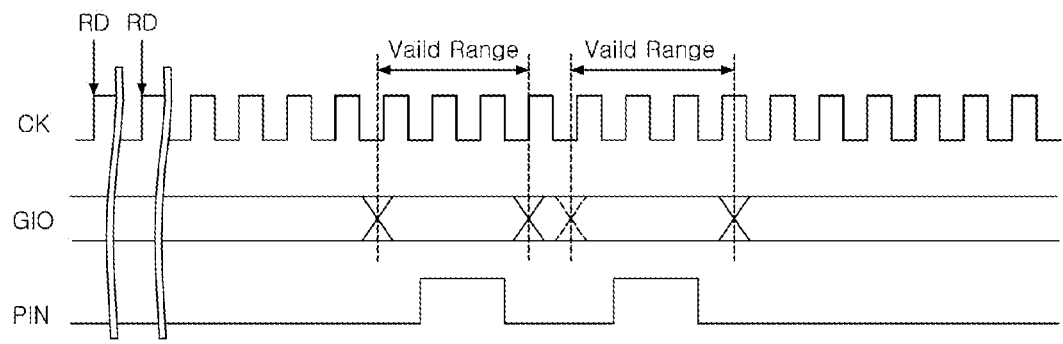
FIGS. 3A and 3B are timing diagrams for describing a data strobing operation of the semiconductor apparatus 100 according to an embodiment of the invention.

Referring to FIG. 3A, the frequency of the clock signal CK is high in the case of the high-speed operation. Accordingly, when read commands RD for accessing different memory banks are repetitively inputted, the valid range of data transmitted through the global input/output line GIO may be narrowed.

In the high-speed operation, the pulse width of the read pulse RD_CASP may be reduced and the delay time of the read pulse RD_CASP may be increased in comparison to when the value of the counting signal CNT<0:M> belongs to the second range. Then, the adjusted signal may be outputted as the strobe signal PIN.

As the read pulse RD_CASP having the reduced pulse width and the increased delay time is outputted as the strobe signal PIN, the strobe signal PIN may be positioned in the valid range such that the data output operation can be stably performed.

Figure 3B:
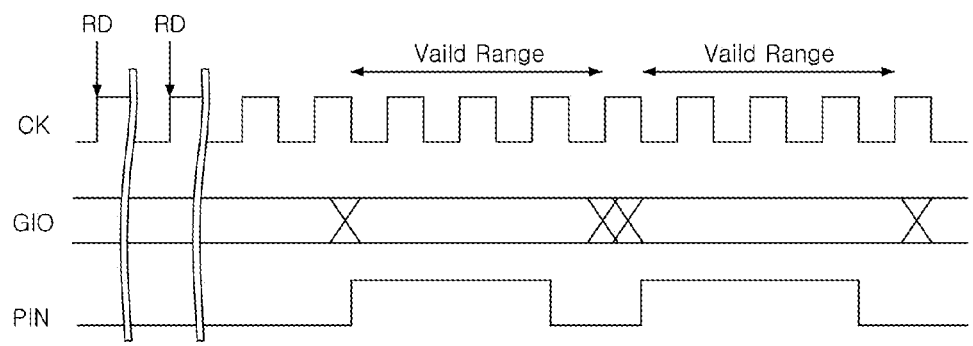

Referring to FIG. 3B, the frequency of the clock signal CK is low in the case of the low-speed operation. Thus, although read commands RD for accessing different memory banks are repetitively inputted, the valid range of data transmitted through the global input/output line GIO may have a sufficient margin.

In the low-speed operation, the pulse width of the read pulse RD_CASP may be increased and the delay time of the read pulse RD_CASP may be reduced in comparison to when the value of the counting signal CNT<0:M> belongs to the second range. Then, the adjusted signal may be outputted as the strobe signal PIN.

As the read pulse RD_CASP having the increased pulse width and the reduced delay time is outputted as the strobe signal PIN, data may be quickly outputted because an address access delay time (tAA) is reduced.

In an embodiment, tAA refers to a data access time corresponding to the shortest time required until data corresponding to a read command RD is outputted through a pad DQ after the read command RD is applied. In the specification, tAA may also refer to a time required until data corresponding to a read command RD is outputted through the pad DQ based on an address inputted with the read command RD.

Figure 4:
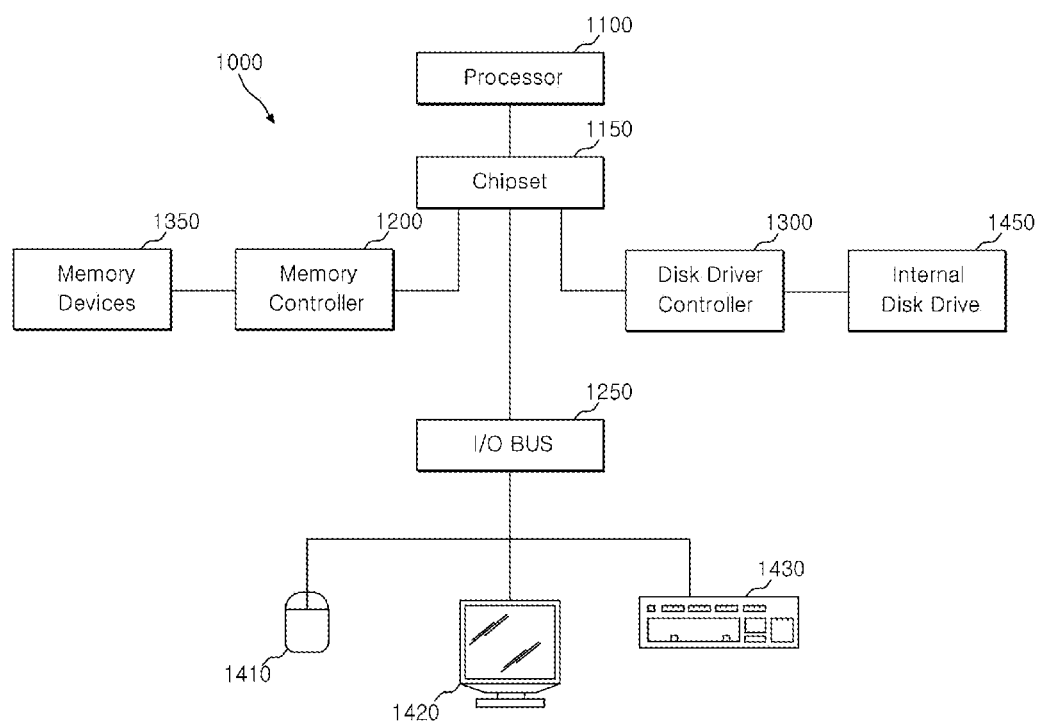
FIG. 4 illustrates a block diagram of a system employing a memory controller circuit in accordance with an embodiment of the invention.

Referring to FIG. 4, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the is semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset using virtually any type of communication protocol.

While certain embodiments have been described above, it will be understood to those skilled in the art that the embodiments described are by way of examples only. Accordingly, the semiconductor apparatus described should not be limited based on the described embodiments. Rather, the semiconductor apparatus described should only be limited in light of the claims that follow to when taken in conjunction with the above description and accompanying figures.

What is claimed is:

1. A data strobing circuit comprising:
   an operating speed detection unit configured to detect an operating speed of a semiconductor apparatus according to a clock signal, and generate a control signal with a different value depending on the detected operating speed; and
   a strobe signal generation unit configured to adjust a delay time and pulse width of a read pulse according to the control signal and output an adjusted signal as a strobe signal.

2. The data strobing circuit according to claim 1, further comprising:
   a latch unit configured to latch data in response to the strobe signal.

3. The data strobing circuit according to claim 1, wherein the operating speed detection unit comprises:
   an oscillator configured to generate an oscillation signal;
   a divider configured to generate a divided clock signal by dividing the clock signal;
   a counter configured to count the divided clock signal using the oscillation signal, and output the count value as a counting signal; and
   a control signal generator configured to generate the control signal by decoding the counting signal.

4. The data strobing circuit according to claim 3, wherein the counter is configured to count the pulse number of the divided clock signal during a predetermined level period of the oscillation signal, and outputs the count value as the counting signal.

5. The data strobing circuit according to claim 1, wherein the strobe signal generation unit comprises:
   a variable delay unit configured to delay the read pulse by a delay time varied according to the control signal; and
   a pulse width adjusting unit configured to adjust a pulse width of a signal outputted from the variable delay unit according to the control signal, and output the adjusted signal as the strobe signal.

6. A data strobing circuit comprising:
   an operating speed detection unit configured to divide a value of a counting signal, generated by counting a clock signal, into a plurality of ranges using an oscillation signal, and generate a control signal having different values allocated to the respective ranges; and
   a strobe signal generation unit configured to differently adjust a delay time and pulse width of a read pulse generated in response to a read command according to the control signal, and output an adjusted signal as a strobe signal.

7. The data strobing circuit according to claim 6, further comprising:
   a latch unit configured to latch data in response to the strobe signal.

8. The data strobing circuit according to claim 6, wherein the operating speed detection unit comprises:
   an oscillator configured to generate the oscillation signal;
   a divider configured to generate a divided clock signal by dividing the clock signal;
   a counter configured to count the divided clock signal using the oscillation signal, and output the count value as the counting signal; and
   a control signal generator configured to generate the control signal by decoding the counting signal.

9. The data strobing circuit according to claim 8, wherein the counter is configured to count the pulse number of the divided clock signal during a predetermined level period of the oscillation signal, and output the count value as the counting signal.

10. The data strobing circuit according to claim 6, wherein the strobe signal generation unit comprises:
    a variable delay unit configured to delay the read pulse by a delay time varied according to the control signal; and
    a pulse width adjusting unit configured to adjust a pulse width of a signal outputted from the variable delay unit according to the control signal, and output the adjusted signal as the strobe signal.

11. A semiconductor apparatus comprising:
    a latch unit configured to generate read data by receiving and latching data transmitted from one or more memory blocks through a global input/output line according to a strobe signal;
    a data output unit configured to output the read data to an exterior portion outside of the semiconductor apparatus; and
    a data strobing circuit configured to detect an operating speed of the semiconductor apparatus according to a clock signal, generate a control signal with a different value according to the detected operating speed, adjust a delay time and pulse width of a read pulse according to the control signal, and output an adjusted signal as the strobe signal.

12. The semiconductor apparatus according to claim 11, further comprising:
    a decoder configured to generate the read pulse by decoding a read command.

13. The semiconductor apparatus according to claim 11, wherein the latch unit comprises a pipe latch.

14. The semiconductor apparatus according to claim 11, wherein the data output unit comprises a plurality of pads and a plurality of drivers.

15. The semiconductor apparatus according to claim 11, wherein the data strobing circuit comprises:
    an operating speed detection unit configured to divide a value of a counting signal, generated by counting the clock signal, into a plurality of ranges using an oscillation signal, and generate the control signal having different values allocated to the respective ranges; and
    a strobe signal generation unit configured to differently adjust a delay time and pulse width of the read pulse generated in response to a read command, according to the control signal, and output the adjusted signal as the strobe signal.

16. The semiconductor apparatus according to claim 15, wherein the operating speed detection unit comprises:
   an oscillator configured to generate the oscillation signal;
   a divider configured to generate a divided clock signal by dividing the clock signal;
   a counter configured to count the divided clock signal using the oscillation signal, and output the count value as the counting signal; and
   a control signal generator configured to generate the control signal by decoding the counting signal.

17. The semiconductor apparatus according to claim 15, wherein the strobe signal generation unit comprises:
   a variable delay unit configured to delay the read pulse by a delay time varied according to the control signal; and
   a pulse width adjusting unit configured to adjust a pulse width of a signal outputted from the variable delay unit according to the control signal, and output the adjusted signal as the strobe signal.

18. The semiconductor apparatus according to claim 15, wherein the value of the counting signal is proportional to a frequency of the clock signal.

19. The semiconductor apparatus according to claim 15, wherein the value of the counting signal is divided into first to third ranges.

* * * * *